United States Patent [19]

Mooney et al.

[11] Patent Number: 5,023,504

[45] Date of Patent: Jun. 11, 1991

[54] PIEZO-ELECTRIC RESONANT VIBRATOR FOR SELECTIVE CALL RECEIVER

[75] Inventors: Charles W. Mooney, Lake Worth; Irving H. Holden, Boca Raton, both of Fla.

[73] Assignee: Motorola, Inc., Schaumburg, Ill.

[21] Appl. No.: 514,981

[22] Filed: Apr. 26, 1990

[51] Int. Cl.[5] .............................................. H01L 41/04

[52] U.S. Cl. ................................ 310/322; 340/825.44; 340/825.46; 310/268

[58] Field of Search ............... 310/321, 322, 323, 328, 310/15, 17, 268; 340/825.44, 825.46

[56] References Cited

U.S. PATENT DOCUMENTS

| | | | |
|---|---|---|---|
| 1,882,394 | 10/1932 | Pierce | 310/15 |
| 2,144,343 | 1/1936 | Newnham | 310/17 |
| 4,132,910 | 1/1979 | Kiss et al. | 310/268 |
| 4,439,640 | 3/1984 | Takaya | 310/321 |
| 4,491,759 | 1/1985 | Kunz et al. | 310/323 |
| 4,720,710 | 1/1988 | Akahori et al. | 340/825.47 |
| 4,918,438 | 4/1990 | Yamasaki | 340/825.46 |

FOREIGN PATENT DOCUMENTS

| | | | |
|---|---|---|---|
| 0855821 | 11/1970 | Canada | 310/15 |

*Primary Examiner*—Mark O. Budd
*Assistant Examiner*—Thomas M. Dougherty
*Attorney, Agent, or Firm*—Philip P. Macnak; Vincent B. Ingrassia; William E. Koch

[57] ABSTRACT

A piezo-electric resonant vibrator is described comprising a resonant armature having a centrally located weight, and at least four planar circular spring members which provide a restoring force normal to the movement of the weighted armature within a non-magnetic housing which encloses and supports the armature. A piezo-electric driver is coupled to the armature for inducing movement of the armature at a predetermined resonant frequency. A ferromagnetic plate is mounted to the housing and magnetically couples to a magnet which is coupled to the weight to maintain tension on the armature when an excitation signal is not supplied to the piezo-electric driver, and the armature is at equilibrium.

21 Claims, 3 Drawing Sheets

— PRIOR ART —

PIEZO-ELECTRIC RESONANT VIBRATOR FOR SELECTIVE CALL RECEIVER

FIELD OF THE INVENTION

This invention relates in general to the field of vibrators, and more particularly to piezo-electric resonant vibrator motors for selective call receivers that provide a tactile (sensory) response to indicate a received message.

BACKGROUND OF THE INVENTION

Selective call receivers, including pagers, typically alert a user of a received message by producing an audio alerting signal. However, the audio signal may be disruptive in various environments, and therefore, vibrators have been utilized to provide a "silent" alerting signal.

Referring to FIG. 1, a conventional vibrator motor 100 comprises a cylindrical body 102, a longitudinal, rotating shaft 104, and an unbalanced, rotating counterweight 106. The cylindrical body 102 is held in place on a printed circuit board 108 by motor bracket 110. The counterweight 106 is attached to the protruding end of the shaft 104 on the vibrator motor 100. Operationally, the motor 100 is energized by a power source causing the shaft 104 and the counterweight 106 to rotate, resulting in the motor 100 vibrating and, consequently, the selective call receiver vibrating, thereby alerting the user.

With the trend to miniaturization, the vibrator motor has become one of the largest components in silent alert type pagers. It is, therefore, difficult to realize further reductions in the size of a silent alert pager unless the vibrator motor itself is reduced in size. However, it is important that the vibration level not be significantly reduced, since it would defeat the advantage of size reduction if the tactile operation was ineffective.

Thus, what is needed is a miniaturized vibrator suitable for use in a selective call receiver for generating a tactile alert.

SUMMARY OF THE INVENTION

In carrying out the invention in one form, there is provided an apparatus for effecting a vibrating motion comprising a member arranged for movement about an equilibrium position and an actuator for causing the member to move at a sub-audible frequency for generating a tactile alert.

DETAILED DESCRIPTION OF THE INVENTION

Figure 2:
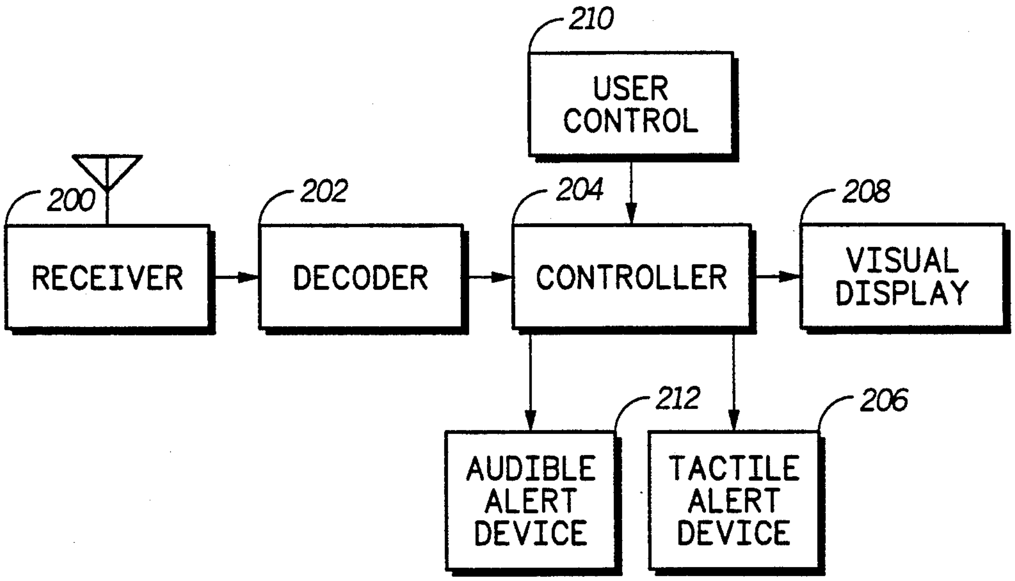
FIG. 2 is a block diagram of a selective call receiver in accordance with the present invention.

Referring to FIG. 2, a selective call receiver (e.g., a pager) comprises an RF receiver 200 for receiving and demodulating a signal, a decoder 202 for decoding the signal, and a controller 204 for presenting an alert and message contained within the signal or an alert only via one of a plurality of output devices 206, 208, and 212. These output devices include one or more of an audible alert (e.g., beep or tone) 212, a tactile alert (i.e. message indicator) 206, and a visual alert 208. Additionally, the alert may be presented in response to selection of a user control 210 (e.g., pushing a button or moving a slide switch). This basic function of a selective call receiver is well known to those skilled in the art.

Figure 1:
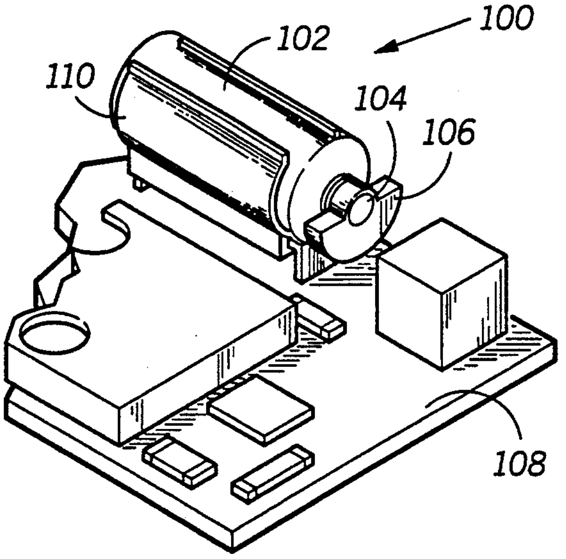
FIG. 1 is a perspective view of a conventional vibrator attached to a printed circuit board.
Figure 3:
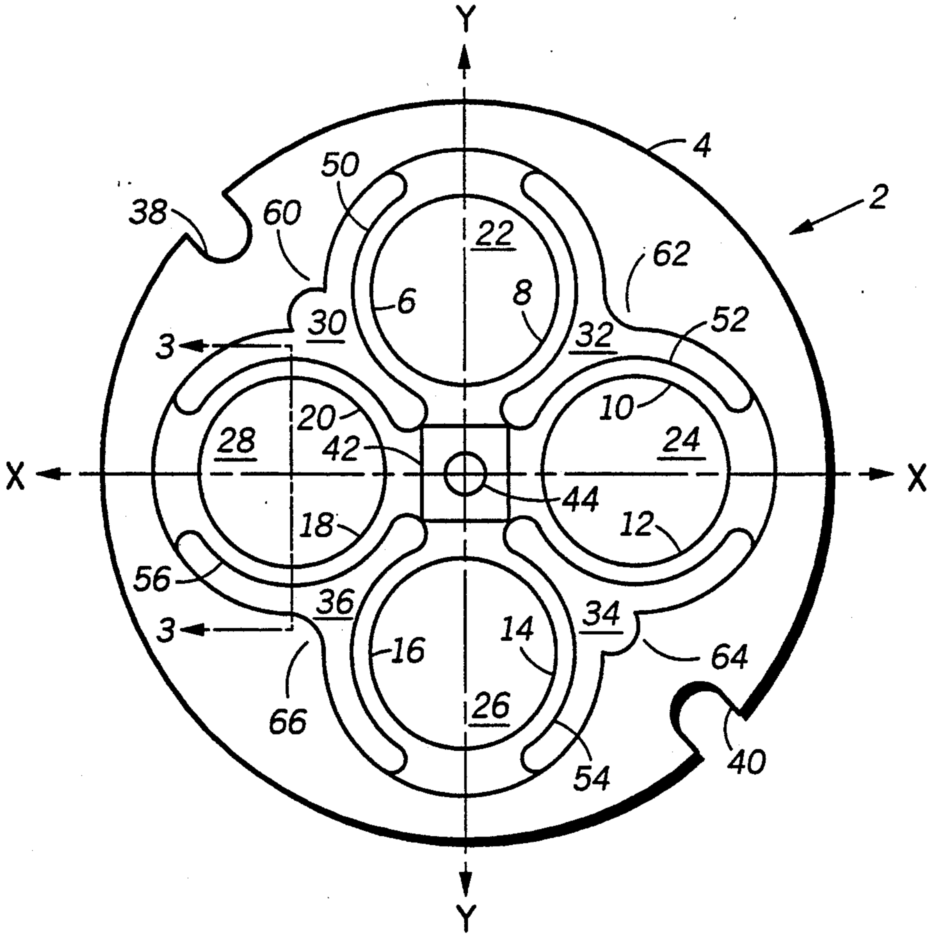
FIG. 3 is a top view of an armature in accordance with the preferred embodiment of the present invention.

Referring to FIG. 3, an armature 2 comprises a body 4 including curved, substantially planar springs 50, 52, 54, and 56 integrally positioned therein, an optional etched surface 42, and an opening 44. The armature 2 is preferably manufactured by a single piece of metal, which may or may not be chemically etched using known techniques to form the following configuration in the preferred embodiment. Each of the springs 50, 52, 54, and 56 comprise two members 6 and 8, 10 and 12, 14 and 16, and 18 and 20, respectively. According to the invention, the springs 50, 52, 54, and 56 are formed by circular openings 22, 24, 26, and 28 and curved openings 30, 32, 34, and 36, respectively. In the preferred embodiment, parabolic openings 38 and 40 are formed for mounting purposes although other variations may be utilized.

In the preferred embodiment, the armature 2 is made of international nickel alloy 902, with springs 50, 52, 54, and 56, chemically etched to membrane thickness (typically 0.003 inches or less). This material is preferably a constant modulus alloy so as to reduce temperature induced frequency changes and force impulse changes. The preferred design of the armature 2 provides a linear spring rate due to the elastic bending of the members 6, 8, 10, 12, 14, 16, 18, and 20. Frequency tuning is preferably accomplished by adjusting the inside diameters of the springs 50, 52, 54, and 56 by any suitable etching, trimming, or grinding process known in the art. The ring geometry makes it possible to elongate each of the members 6, 8, 10, 12, 14, 16, 18, and 20 (by approximately 0.0015 inches) without exceeding the required maximum fatigue stress level (30,000 psi) for the material selected in the preferred embodiment. It should be understood that the shapes and dimensions may vary without deviating from the intent of the invention.

The unique feature of the restoring force and spring force, of the present invention, is that it is generated from the plane of the axes X—X and Y—Y (FIG. 3), which are 90° out of phase with the operational mode of the axis Z—Z. In addition, the force is balanced equally by the outer diameter of the armature's 2 supporting structure.

The tactile alerting device 206 provides a linear spring rate in the axis Z—Z which is accomplished by the elastic bending of the outside diameter of springs 50, 52, 54, and 56 due to tension in the armature 2 in the plane of the axes X—X and Y—Y (FIG. 3) during the operational mode of the axis Z—Z. This makes the frequency of response independent of the amplitude of deflection and the driving signal. The tactile alerting device 206 also provides a frequency of response that is independent of the mass of the pager. Therefore, the present invention provides a more efficient tactile vibrator, requiring less power than the conventional cylindrical housing vibrator while producing a similar sensory level of vibration.

Figure 4:
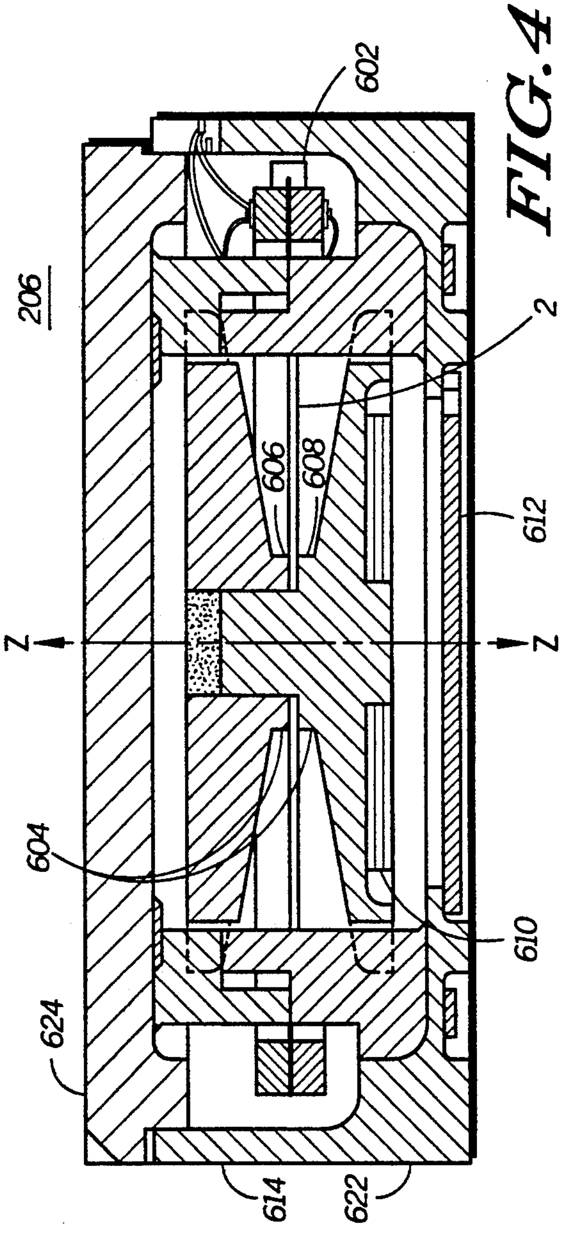
FIG. 4 is a cross sectional view taken along line Y—Y of FIG. 3.

Referring to FIG. 4, the tactile alert device 206 preferably comprises the armature 2, positioned within a housing 614 and coupled substantially around the perimeter of the armature 2 to the housing 614. The housing 614 comprises two plates 622 and 624. The preferred embodiment of the invention comprises a piezo-electric mechanism 602 for vibrating the tactile alert device 206. At least one piezo-ceramic ring 602 is coupled to the armature 2. The piezo-ceramic ring 602 is attached to the perimeter of the armature 2 using a high Q mechanical adhesive, such as Armstrong 702. The armature 2 is coupled to a member (i.e. weight) 604 having an upper portion 606 and a lower portion 608, which are preferably constructed of a non-magnetic metal. The upper portion 606 and the lower portion 608 of the weight 604 engage through the opening 44 in the armature 2 (FIG. 3). Thus, the weight 604 is attached to the armature 2 for movement about an equilibrium position.

As can be seen, the armature 2 is positioned between the upper portion 606 and lower portion 608 within the housing 614 at four points 60, 62, 64, and 66 (FIG. 3). This arrangement of the armature 2 and the housing 614 allows the armature 2 to expand in size along the axis X—X and Y—Y, in response to a force applied outwardly around the perimeter of the armature 2. The armature 2 returns to its original dimensions when the force is removed. The lower portion 608 of the weight 604 is also coupled to a magnet 610. The magnet 610 attracts a fixed metal shield 612, which maintains tension on the armature 2.

According to the invention, an alternating voltage is applied to the piezo-ceramic ring 602 to cause the piezo-ceramic ring 602 to alternately expand in size and return to equilibrium. The induced movement in the armature 2 is along the axis X—X and Y—Y (FIG. 3). The resulting movement of the weight 604 is along the axis Z—Z. The magnetic force between the magnet 610 and the shield 612 maintains tension on the armature 2 while the piezo-ceramic ring 602 expands and returns. Therefore, the piezo-electric mechanism 602 composes an actuator for causing the weight 604 to move in response to an alternating voltage applied to the piezo-ceramic ring 602.

The weight 604 and the armature 2 are mechanically tuned to naturally resonate at a sub-audible frequency of approximately 70 Hz. The armature 2 is coupled to the housing 614 for transferring movement of the weight 604 to the housing 614 to generate a tactile alert. Since 70 Hz comprises a subaudible frequency, no substantial audible sound will be heard. Therefore, the present invention provides a tactile alert by generation of a sub-audible signal.

At mechanical resonance, the energy required to move the armature 2 and weight 604 is substantially reduced, which increases the selective call receiver's battery life. In addition, a maximum amplitude and impulse is provided at a relatively small power consumption. This is due chiefly to the restoring force created by tension in the springs 50, 52, 54, and 56 as each member 6, 8, 10, 12, 14, 16, 18, and 20 of the springs 50, 52, 54, and 56, extends (approximately 0.0015 inches). The restoring force is balanced by the perimeter of the armature 2, which is coupled to the housing 402. The driving force (unbalanced) is in the axis Z—Z and is typically 10% of the balanced restoring force, which is in the axis X—X and Y—Y. Therefore, the system uses approximately 10% of the stored energy to move the message indicator 206 (and thus the selective call receiver) each cycle, which increases the system's battery life.

According to the invention, the indicator 206 generates an impulse toward the user in one direction as compared to the prior art motor 100 which generates an impulse in all radial directions within the plane of rotational motion of the external unbalanced counterweight 106. Therefore, much of the force generated by contemporary motors 100 are not felt in a tactile sense by the user. However, an equivalent tactile sensory response is obtained by the present invention while using less power and space than the conventional motor 100.

Figure 5:
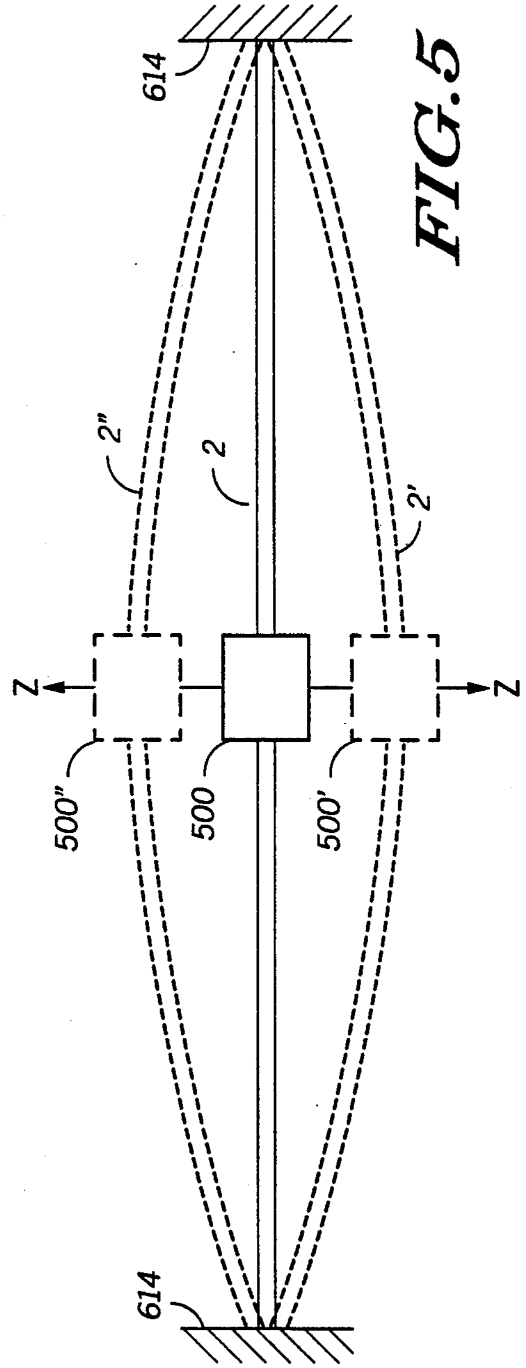
FIG. 5 is an exemplary side view of the armature in a vibratory motion.

Referring to FIGS. 4 and 5, the armature 2 is in its stationary (equilibrium) position within message indicator 206 with a mass 500 comprised of the weight 604, and the magnet 610. The armature 2 is held substantially rigid to the housing 614 along the perimeter. As the indicator 206 begins to vibrate, the armature 2 and mass 500 will move from its stationary position, along axis Z—Z, to its maximum amplitude as represented by armature 2' and mass 500'. Due to the spring force provided by springs 50, 52, 54, and 56 along the Z—Z axis and the actuating signal applied to the coil 412, the armature 2' and mass 500' will oscillate to the opposed extreme as represented by armature 2'' and mass 500'. In the preferred embodiment of the present invention, these oscillations produce the tactile alert at the frequency of approximately 70 Hz.

One advantage of the tactile alerting device 206 is that it generates an impulse toward the user in one direction while the conventional cylindrical motor 100 generates an impulse in all directions; therefore, much of the force generated by the motor 100 is not felt. An equivalent tactile sensory response is then obtained using the tactile alerting device 206 while using less power and space than the conventional motor 100. In addition, the gravity effect of the tactile alerting device 206 is relatively small as compared to the conventional motor 100 since the armature 2 is balanced whereas the conventional motor 100 utilizes an unbalanced counterweight 106. The gravity effect on the conventional motor is then dependent on the relationship between the shaft 104 and the unbalanced counterweight 106. Therefore, a further advantage of the tactile alerting device 206 is that the gravity effect will result in a smaller reduction in impulse force than the conventional motor 100 due to the resonant nature of the system.

What is claimed is:

1. A piezoelectric resonant vibrator, comprising:

an armature having a planar circular perimeter region, a planar central region, and a plurality of planar circular spring members, arranged regularly around said central region within said perimeter region, and coupled to said perimeter region and to said central region;

a weight, coupled to said central region, said weight including a magnetic member for maintaining tension on said armature;

actuator means, coupled to said perimeter region, for inducing movement of said armature at a predetermined resonant frequency; and a housing, comprising an upper member and a lower member, coupled to said perimeter region, for enclosing and supporting said armature.

2. The piezoelectric resonant vibrator of claim 1, wherein said armature has an upper surface and a lower surface, and wherein a first portion of said weight is coupled to the upper surface of said central region, and a second portion of said weight is coupled to said lower surface of said central region.

3. The piezoelectric resonant vibrator of claim 2, wherein said weight is fabricated from a non-magnetic material.

4. The piezoelectric resonant vibrator of claim 2, wherein said housing further includes a ferromagnetic member, coupled to said lower housing member, and wherein said magnetic member is coupled to said second portion of said weight, whereby the tension on said armature is maintained by the attraction of said magnetic member to said ferromagnetic member.

5. The piezoelectric resonant vibrator of claim 1, wherein said armature is fabricated from sheet metal.

6. The piezoelectric resonant vibrator of claim 5, wherein said sheet metal is a nickel alloy.

7. The piezoelectric resonant vibrator of claim 1, wherein said planar circular spring members have a rectangular cross-section wherein the width is substantially greater than the thickness.

8. The piezoelectric resonant vibrator of claim 1, wherein said housing is fabricated from a nonmagnetic material.

9. The piezoelectric resonant vibrator of claim 1, wherein said actuator means is a piezo-ceramic ring driver.

10. The piezoelectric resonant vibrator of claim 1, wherein said armature includes at least four planar circular spring members.

11. The piezoelectric resonant vibrator of claim 10, wherein said planar circular spring members are arranged orthogonally around said central region within said perimeter region.

12. The piezoelectric resonant vibrator of claim 1, wherein the armature movement is normal to the direction of the restoring force.

13. The piezoelectric resonant vibrator of claim 1, wherein the resonance of the armature is subaudible.

14. The piezoelectric resonant vibrator of claim 13, wherein the resonant frequency of said planar circular spring members is tunable by adjusting the inside diameter of said members.

15. A piezoelectric resonant vibrator, comprising:

a planar resonant armature having a centrally located weight, and including a plurality of planar spring members for providing a restoring force normal to the movement of the weighted armature;

a housing for enclosing and supporting said armature; and actuator means, coupled to said armature, for inducing movement of said armature at a predetermined resonant frequency.

16. The piezoelectric resonant vibrator of claim 1, wherein said actuator means is a piezo-ceramic ring driver which radially expands to produce an impulse to the armature at the resonant frequency when electrically excited.

17. The piezoelectric resonant vibrator of claim 15, wherein said armature includes at least four planar spring members.

18. The piezoelectric resonant vibrator of claim 17, wherein said planar spring members are arranged orthogonally about said central weight.

19. The piezoelectric resonant vibrator of claim 15, wherein said planar spring members have a circular geometry.

20. The piezoelectric resonant vibrator of claim 15, further comprising:

a ferromagnetic member coupled to said housing; and a magnetic member coupled to said armature, and magnetically coupled to said ferromagnetic member, for maintaining tension on said armature.

21. A selective call receiver providing a vibrating alert, comprising:

a receiver for receiving and detecting selective call signals;

a decoder, responsive to the selective call signals, for generating an alert signal in response thereto;

and a piezoelectric resonant vibrator, comprising a resonant armature having a centrally located weight, and including a plurality of planar spring members for providing a restoring force normal to the movement of the weighted armature, and an actuator means, coupled to said armature and responsive to the alert signal, for inducing movement of said armature at a predetermined resonant frequency to provide the vibrating alert.

* * * * *